United States Patent
Kon et al.

(10) Patent No.: US 11,773,292 B2
(45) Date of Patent: *Oct. 3, 2023

(54) POLISHING COMPOSITION

(71) Applicant: FUJIMI INCORPORATED, Aichi (JP)

(72) Inventors: Hiroki Kon, Aichi (JP); Naoto Noguchi, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/490,179

(22) Filed: Sep. 30, 2021

(65) Prior Publication Data

US 2022/0017782 A1 Jan. 20, 2022

Related U.S. Application Data

(63) Continuation of application No. 16/649,407, filed as application No. PCT/JP2018/036320 on Sep. 28, 2018, now Pat. No. 11,225,590.

(30) Foreign Application Priority Data

Sep. 29, 2017 (JP) ................. 2017-189363

(51) Int. Cl.
  *C09G 1/02* (2006.01)
  *H01L 21/321* (2006.01)
  *H01L 21/304* (2006.01)
  *H01L 21/306* (2006.01)

(52) U.S. Cl.
  CPC ............ *C09G 1/02* (2013.01); *H01L 21/304* (2013.01); *H01L 21/3212* (2013.01); *H01L 21/30625* (2013.01)

(58) Field of Classification Search
  CPC ..... C09G 1/02; H01L 21/304; H01L 21/3212; H01L 21/30625; H01L 21/02024; B24B 37/00; C09K 3/14
  USPC ................................................ 438/690–693
  See application file for complete search history.

(56) References Cited

U.S. PATENT DOCUMENTS

| 6,083,419 A * | 7/2000 | Grumbine | C09G 1/02 438/692 |
| 11,225,590 B2 * | 1/2022 | Kon | C09G 1/02 |
| 2007/0068901 A1 * | 3/2007 | Yuchun | C23F 3/06 438/692 |
| 2008/0173843 A1 | 7/2008 | Hotta et al. | |
| 2012/0080408 A1 | 4/2012 | Ui et al. | |
| 2013/0140273 A1 | 6/2013 | Lu et al. | |
| 2016/0208141 A1 | 7/2016 | Ho et al. | |
| 2017/0306526 A1 | 10/2017 | Okita | |
| 2017/0320187 A1 | 11/2017 | Takahashi et al. | |
| 2017/0321098 A1 | 11/2017 | Takahashi | |
| 2019/0153278 A1 | 5/2019 | Takahashi et al. | |

FOREIGN PATENT DOCUMENTS

| CN | 102516875 A | 6/2012 |
| CN | 107107302 A | 8/2017 |
| JP | 2010023198 A | 2/2010 |
| JP | 2010023199 A | * 2/2010 |
| JP | 2010023199 A | 2/2010 |
| JP | 2012079886 A | 4/2012 |
| JP | 5095228 B2 | 12/2012 |
| JP | 2018032785 A | 8/2018 |
| KR | 20130071089 A | 6/2013 |
| TW | 2016167431 A | 5/2016 |
| TW | 201623552 A | 7/2016 |
| WO | 2016063632 A1 | 4/2016 |
| WO | 2016072370 A1 | 5/2016 |

OTHER PUBLICATIONS

International Search Report and Written Opinion of PCT/JP2018/036320 dated Oct. 30, 2018.
English Translation of the International Preliminary Report on Patentability of PCT/JP2018/036320 dated Apr. 9, 2020.
First Office Action for CN Application No. 201880061678.7, dated Dec. 2, 2020.
Decision of Rejection for CN Application No. 201880061678.7 with a dated Jan. 19, 2022.
Second Office Action in CN Application No. 201880061678.7 dated Sep. 24, 2021.
First Office Action in TW Application No. 107134424 dated Dec. 13, 2021.
First Office Action in JP Application No. 2019-545151, dated Sep. 29, 2022.
First Office Action in CN Application No. 202210941941.X dated Jun. 15, 2023.

\* cited by examiner

*Primary Examiner* — Duy Vu N Deo
(74) *Attorney, Agent, or Firm* — Katten Muchin Rosenman LLP

(57) ABSTRACT

An object of the present invention is to provide a polishing composition that can achieve both a high polishing removal rate and high surface quality. According to the present invention, provided is a polishing composition for polishing a material to be polished. The polishing composition contains sodium metavanadate, hydrogen peroxide, and silica abrasive. The content $C1$ of sodium metavanadate is 0.7% to 3.5% by weight, the content $C2$ of hydrogen peroxide is 0.3% to 3% by weight, and the content $C3$ of the silica abrasive is 12% to 50% by weight.

11 Claims, No Drawings

POLISHING COMPOSITION

CROSS-REFERENCE TO RELATED APPLICATIONS

This application is a continuation application of U.S. patent application Ser. No. 16/649,407, filed on Mar. 20, 2020, which is a 35 U. S.C. § 371 national stage application of International Application No. PCT/JP2018/036320, filed on Sep. 28, 2018, which claims the benefit of Japanese patent application No. 2017-189363, filed on Sep. 29, 2017, the disclosures of which are incorporated herein by reference in their entirety for all purposes.

TECHNICAL FIELD

The present invention relates to a polishing composition, and specifically, to a polishing composition used for polishing a material to be polished. The present application claims priority based on Japanese Patent Application No. 2017-189363 filed on 29 Sep. 2017, the entire contents of which application are incorporated herein by reference.

BACKGROUND ART

The surface of a material to be polished such as diamond, sapphire (aluminum oxide), silicon carbide, boron carbide, tungsten carbide, silicon nitride, and titanium nitride is generally processed by polishing (lapping) that is performed by supplying diamond abrasive to a polishing platen. However, in lapping using diamond abrasive, defects and strains are likely to occur due to the generation and remaining of scratches and the like. Therefore, after lapping using diamond abrasive or in place of the lapping, polishing in which a polishing pad is used and a polishing slurry is supplied between the polishing pad and an object to be polished is studied. Examples of literature in which this type of the related art is disclosed include Patent Literature 1.

CITATION LIST

Patent Literature

Patent Literature 1: Japanese Patent No. 5095228

SUMMARY OF INVENTION

Technical Problem

In recent years, higher quality surfaces have been required for polished objects of silicon carbide or the like (for example, semiconductor substrates and other substrates). Therefore, there is a need for a polishing composition that can realize a polished surface with high surface quality (for example, with a small number of scratches) while satisfying practically required levels for a polishing removal rate (a removed amount of an object to be polished from its surface per unit time).

The present invention has been made in view of the above circumstances and a main object of the present invention is to provide a polishing composition with which both a high polishing removal rate and high surface quality can be achieved. Another related object is to provide a method of producing a polished object using the polishing composition.

Solution to Problem

According to the present invention, provided is a polishing composition used for polishing an object to be polished. The polishing composition contains sodium metavanadate, hydrogen peroxide, and silica abrasive. The content C1 of sodium metavanadate is 0.7% to 3.5% by weight. The content C2 of hydrogen peroxide is 0.3% to 3% by weight. The content C3 of the silica abrasive is 12% to 50% by weight. In this manner, when a combination of specific contents of sodium metavanadate, hydrogen peroxide, and silica abrasive is used, both a high polishing removal rate and excellent surface quality can be achieved at a high level.

In a preferred embodiment of the polishing composition disclosed here, a weight-based ratio of the content C2 of hydrogen peroxide to the content C1 of sodium metavanadate (C2/C1) is 0.5 or more and 2 or less. A weight-based ratio of the content C3 of the silica abrasive to the content C1 of sodium metavanadate (C3/C1) is 5 or more and 40 or less. In such a configuration, the effects of the present invention can be exhibited more preferably.

In a preferred embodiment of the polishing composition disclosed here, a weight-based ratio of the content C3 of the silica abrasive to the content C1 of sodium metavanadate (C3/C1) is 12.5 or more. In such a configuration, the effects of the present invention can be exhibited more preferably.

The polishing composition according to a preferred embodiment further contains a water-soluble polymer. In such a configuration, the application effect of the present invention can be more suitably exhibited.

In a preferred embodiment of the polishing composition disclosed here, a constituent material of an object to be polished has a Vickers hardness of 1,500 Hv or higher. When the polishing composition is applied to the material which has a high hardness, the effect of the present invention can be more suitably exhibited.

In a preferred embodiment of the polishing composition disclosed here, a material constituting the object is silicon carbide. When the polishing composition is applied to silicon carbide, the surface quality after polishing can be improved and a high polishing removal rate can be achieved.

In addition, according to the present invention, a method of polishing an object to be polished is provided. The polishing method includes supplying any of the polishing compositions disclosed here to an object to be polished and polishing the object. According to the polishing method, it is possible to efficiently provide an object to be polished having a high-quality surface (polished object).

DESCRIPTION OF EMBODIMENTS

Preferred embodiments of the present invention will be described below. Incidentally, matters that is other than those particularly mentioned herein but are necessary for implementation of the present invention can be recognized by those skilled in the art as design matters based on the prior art in the relevant field. The present invention can be implemented based on content disclosed herein and common general technical knowledge in the field.

<Object to be Polished>

A polishing composition disclosed here can be applied for polishing an object to be polished made of a material containing no oxygen as a constituting element. Examples of a constituent material of an object to be polished include a monoelemental semiconductor or a monoelemental insulator such as silicon, germanium, and diamond; a ceramic material such as silicon nitride, tantalum nitride, and titanium carbide; a semiconductor substrate material of Groups II-VI compounds such as cadmium telluride, zinc selenide, cadmium sulfide, cadmium mercury telluride, and zinc cadmium telluride; a semiconductor substrate material of Groups III-V compounds such as gallium nitride, gallium arsenide, gallium phosphide, indium phosphide, aluminum gallium arsenide, indium gallium arsenide, indium gallium arsenide nitride, and aluminum gallium indium phosphide; a semiconductor substrate material of Groups IV-IV compounds such as silicon carbide, and germanium silicide; and the like. An object to be polished made of a plurality of materials among them may be used. Among them, it is preferably used for polishing a material having a Vickers hardness of 500 Hv or higher. A Vickers hardness of a material to be polished is preferably 700 Hv or higher (for example 1,000 Hv or higher, typically 1,500 Hv or higher). The upper limit of the Vickers hardness is not particularly limited, and may be about 7,000 Hv or lower (for example, 5,000 Hv or lower, typically 3,000 Hv or lower). Herein, the Vickers hardness can be measured based on JIS R 1610: 2003. The international standard corresponding to the JIS standard is ISO 14705:2000.

Examples of a material having a Vickers hardness of 1,500 Hv or higher include diamond, silicon carbide, silicon nitride, titanium nitride, gallium nitride and the like. The polishing composition disclosed here can be preferably applied to a single crystal surface of the material that is mechanically and chemically stable. Among them, the surface of the object is preferably made of any of diamond, silicon carbide, and gallium nitride, and more preferably made of silicon carbide. Silicon carbide is expected to be a semiconductor substrate material having low power loss and excellent heat resistance and the like, and has a particularly large practical advantage of improving surface properties. The polishing composition disclosed here is particularly preferably applied to a single crystal surface of silicon carbide.

<Polishing Composition>

The polishing composition disclosed here contains sodium metavanadate ($NaVO_3$), hydrogen peroxide ($H_2O_2$), and silica abrasive. The content C1 of sodium metavanadate is 0.7% to 3.5% by weight, the content C2 of hydrogen peroxide is 0.3% to 3% by weight, and the content C3 of the silica abrasive is 12% to 50% by weight. In this manner, when a combination of specific contents of sodium metavanadate, hydrogen peroxide, and silica abrasive is used, both a high polishing removal rate and excellent surface quality can be achieved at a high level.

The reason why such effects are obtained is inferred, for example, to be as follows. That is, in polishing using a polishing composition including sodium metavanadate, hydrogen peroxide, and silica abrasive, vanadate ions generated by ionization of sodium metavanadate receive oxygen from hydrogen peroxide to generate peroxovanadate ions, the peroxovanadate ions alter a surface of a material to be polished (for example, in the case of silicon carbide, oxidative cleavage of the Si—C bond), and the altered layer is mechanically removed by silica abrasive. According to a polishing composition having the above configuration, a combination of specific contents of sodium metavanadate, hydrogen peroxide, and silica abrasive is used, and thus a rate at which the surface of the material to be polished is altered due to sodium metavanadate and hydrogen peroxide and a rate at which the altered layer is scraped off by silica abrasive are appropriately balanced. Therefore, silica abrasive do not scrape the surface of the material to be polished before alteration or excessively cut the surface after alteration (thus, reducing the occurrence of polishing scratches such as scratching caused when an unaltered surface with high hardness is scraped off) and the surface is efficiently scraped off. This is thought to contribute to improvement in the polishing removal rate and the surface quality. However, the present invention is not interpreted to be limited to such reasons.

(Sodium Metavanadate)

The content C1 of sodium metavanadate in the polishing composition is about 0.7% by weight or more. In consideration of polishing removal rate and the like, the content C1 of sodium metavanadate is preferably 0.8% by weight or more, and more preferably 0.9% by weight or more. In some embodiments, the content C1 of sodium metavanadate may be, for example, 1.2% by weight or more, and typically 1.5% by weight or more. In addition, from the standpoint of achieving a balance between a polishing removal rate and surface quality at a high level and the like, the content C1 of sodium metavanadate is about 3.5% by weight or less. The content C1 of sodium metavanadate is preferably 3.2% by weight or less, and more preferably 3% by weight or less. In some embodiments, the content C1 of sodium metavanadate may be, for example, 2.5% by weight or less, and typically 2.2% by weight or less. In the art disclosed here, an embodiment in which the content C1 of sodium metavanadate in the polishing composition is 0.9% by weight or more and 3% by weight or less can be preferably performed. Sodium metavanadate is appropriate as a vanadate suitable for the object of the present invention because it has higher solubility in water than vanadates such as ammonium metavanadate and is homogeneously soluble in the polishing composition even if it has the above high concentration. In addition, since sodium metavanadate is less expensive than potassium metavanadate and the like, it is advantageous in consideration of cost.

(Hydrogen Peroxide)

The content C2 of hydrogen peroxide in the polishing composition is about 0.3% by weight or more. In consideration of polishing removal rate and the like, the content C2 of hydrogen peroxide is preferably 0.5% by weight or more, and more preferably 0.8% by weight or more. In some embodiments, the content C2 of hydrogen peroxide may be, for example, 1% by weight or more, and typically, 1.1% by weight or more. In addition, from the standpoint of achieving a balance between a polishing removal rate and surface quality at a high level and the like, the content C2 of hydrogen peroxide is about 3% by weight or less. The content C2 of hydrogen peroxide is preferably 2.8% by weight or less, and more preferably 2.7% by weight or less. In some embodiments, the content C2 of hydrogen peroxide may be, for example, 2.2% by weight or less, and typically, 1.8% by weight or less (for example, 1.5% by weight or less). In the art disclosed here, an embodiment in which the content C2 of hydrogen peroxide in the polishing composition is 1.2% by weight or more and 2.7% by weight or less can be preferably performed. Since hydrogen peroxide has an oxidation-reduction potential sufficient to allow an action of donating oxygen to vanadate ions generated by ionization of sodium metavanadate, it is an oxygen donor suitable for the object of the present invention.

From the standpoint of exhibiting an effect obtained when sodium metavanadate and hydrogen peroxide are used in combination more favorably, a weight-based content ratio (C2/C1) of hydrogen peroxide to sodium metavanadate is appropriately 0.5 or more and 2 or less, preferably 0.6 or more and 1.9 or less, and more preferably 0.7 or more and 1.8 or less. When a combination of sodium metavanadate and hydrogen peroxide in a specific content ratio is used, a balance between a polishing removal rate and surface quality can be achieved at a higher level. In some embodiments, the content ratio (C2/C1) of hydrogen peroxide to sodium metavanadate may be, for example, 0.7 or more and 1.5 or less, and typically 0.7 or more and 1.2 or less.

In consideration of polishing removal rate and the like, the content C1 of sodium metavanadate is preferably larger than the content C2 of hydrogen peroxide (that is, C1>C2). The content C1 of sodium metavanadate is larger than the content C2 of hydrogen peroxide preferably by 0.3% by weight or more, and more preferably by 0.5% by weight or more. In addition, a value obtained by subtracting the content C2 of hydrogen peroxide from the content C1 of sodium metavanadate (that is, C1-C2) is preferably 2% by weight or less, more preferably 1.5% by weight or less, and still more preferably 1.2% by weight or less. In some embodiments, C1-C2 may be, for example, 1% by weight or less, and typically 0.8% by weight or less.

Although not particularly limited, a total content of the content C1 of sodium metavanadate and the content C2 of hydrogen peroxide (that is, C1+C2) is preferably 1% by weight or more. C1+C2 is more preferably 1.5% by weight or more, still more preferably 2% by weight or more, and particularly preferably 2.5% by weight or more (for example, 2.8% by weight or more). In addition, C1+C2 is preferably 6.5% by weight or less, more preferably 6% by weight or less, and still more preferably 5.5% by weight or less. In some embodiments, C1+C2 may be, for example, 4.5% by weight or less, and typically 4% by weight or less.

(Abrasive)

The polishing composition disclosed here contains silica abrasive. The silica abrasive can be appropriately selected from among various known silica particles and used. Examples of such known silica particles include colloidal silica and dry silica. Among these, colloidal silica is preferably used. By using silica abrasive containing colloidal silica, a high polishing removal rate and high surface accuracy can be suitably achieved. Examples of colloidal silica here include silica produced using an alkali silicate solution containing an alkali metal such as Na and K, and $SiO_2$ (for example, a sodium silicate solution) as raw materials and silica (alkoxide silica) produced by a hydrolytic condensation reaction of an alkoxysilane such as tetraethoxysilane and tetramethoxysilane. In addition, examples of dry silica include silica (fumed silica) obtained by burning silane compounds such as silicon tetrachloride and trichlorosilane typically in a hydrogen flame and silica produced by a reaction between metallic silicon and oxygen.

The shape (outer shape) of silica abrasive may be globular or non-globular. Specific examples of shapes of non-globular silica abrasive include a peanut shape (that is, a peanut shell shape), a cocoon shape, a konpeito shape, and a rugby ball shape. In the art disclosed here, the silica abrasive contained in the polishing composition may be in the form of primary particles or in the form of secondary particles in which a plurality of primary particles are association with one another. In addition, silica abrasive in the form of primary particles and silica abrasive in the form of secondary particles may be mixed. In a preferred embodiment, at least some of silica abrasive in the form of secondary particles are included in the polishing composition.

Silica abrasive having an average primary particle diameter (hereinafter simply referred to as "D1") of larger than 5 nm are preferably used. In consideration of polishing removal rate and the like, D1 is preferably 15 nm or more, more preferably 20 nm or more, still more preferably 25 nm or more, and particularly preferably 30 nm or more. The upper limit of D1 is not particularly limited, but is appropriately about 120 nm or less, preferably 100 nm or less, and more preferably 85 nm or less. For example, from the standpoint of achieving both a higher polishing removal rate and higher surface quality, silica abrasive having a D1 of 12 nm or more and 80 nm or less are preferable, silica abrasive having a D1 of 15 nm or more and 60 nm or less are more preferable, and silica abrasive having a D1 of 20 nm or more and 50 nm or less are particularly preferable. For example, silica abrasive having a D1 of 25 nm or more and 40 nm or less (for example, 35 nm or less) may be used.

Here, in the art disclosed here, the average primary particle diameter of the abrasive is a particle size calculated by a formula of average primary particle diameter (nm)=6,000/(true density ($g/cm^3$)×BET value ($m^2/g$)) from a specific surface area (BET value) measured according to a BET method. For example, in the case of silica abrasive, an average primary particle diameter can be calculated according to average primary particle diameter (nm)=2727/BET value ($m^2/g$). The specific surface area can be measured using, for example, a surface area measuring device, product name "Flow Sorb II 2300" (commercially available from Micromeritics Instrument Corp.).

The average secondary particle diameter of the silica abrasive (hereinafter simply referred to as "D2") is not particularly limited, but is preferably 20 nm or more, more preferably 50 nm or more, and still more preferably 70 nm or more in consideration of polishing removal rate and the like. In addition, from the standpoint of a surface with higher quality, the average secondary particle diameter D2 of the silica abrasive is appropriately 500 nm or less, preferably 300 nm or less, more preferably 200 nm or less, still more preferably 130 nm or less, and particularly preferably 110 nm or less (for example, 90 nm or less).

Here, in the art disclosed here, the average secondary particle diameter of the abrasive can be measured as a volume average particle diameter (volume-based arithmetic average size; Mv) according to a dynamic light scattering method, for example, using the model "UPA-UT151" (commercially available from Nikkiso Co., Ltd.).

The content C3 of the silica abrasive in the polishing composition is about 12% by weight or more. In consideration of polishing removal rate and the like, the content C3 of the silica abrasive is preferably 15% by weight or more. In some embodiments, the content C3 of the silica abrasive may be, for example, 20% by weight or more, and typically, 24% by weight or more (for example, 28% by weight or more). In addition, from the standpoint of achieving a balance between a polishing removal rate and surface quality at a high level and the like, the content C3 of the silica abrasive is about 50% by weight or less. The content C3 of the silica abrasive is preferably 48% by weight or less, and more preferably 45% by weight or less. In some embodiments, the content C3 of the silica abrasive may be, for example, 42% by weight or less, and typically, 38% by weight or less (for example, 35% by weight or less). The art disclosed here can be preferably implemented in an embodiment in which the content C3 of the silica abrasive in the polishing composition is 12% by weight or more and 45% by weight or less (further, 12% by weight or more and 40% by weight or less).

From the standpoint of exhibiting an effect obtained when sodium metavanadate and silica abrasive are used in combination more favorably and the like, a weight-based content ratio (C3/C1) of silica abrasive to sodium metavanadate is appropriately 2 or more and 50 or less, preferably 5 or more and 40 or less, and more preferably 8 or more and 35 or less. When a combination of sodium metavanadate and silica abrasive in a specific content ratio is used, a balance between a polishing removal rate and surface quality can be achieved at a higher level. In some embodiments, a content ratio (C3/C1) of silica abrasive to sodium metavanadate may be, for example, 10 or more and 30 or less or 12.5 or more and 25 or less, and typically 15 or more and 20 or less. Within such a range of the content ratio, a polishing removal rate improvement effect can be exhibited more suitably.

Although not particularly limited, a value of a ratio (C3/(C1+C2)) of the content C3 of the silica abrasive to a total content of the content C1 of sodium metavanadate and the content C2 of hydrogen peroxide is preferably 2 or more. The value of the ratio is more preferably 3 or more, and still more preferably 4 or more. In some embodiments, the value of the ratio may be, for example, 6 or more, and typically 8 or more (for example, 10 or more). In addition, the value of the ratio is preferably 30 or less, more preferably 25 or less, and still more preferably 20 or less.

As long as the effects of the present invention are not impaired, the polishing composition disclosed here may contain abrasive made of a material other than the above silica (hereinafter also referred to as non-silica abrasive). Examples of such non-silica abrasive include abrasive substantially composed of any of oxide particles such as alumina particles, cerium oxide particles, chromium oxide particles, titanium dioxide particles, zirconium oxide particles, magnesium oxide particles, manganese oxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate.

The content of the non-silica abrasive is appropriately, for example, 30% by weight or less, preferably 20% by weight or less, and more preferably 10% by weight or less, with respect to the total weight of the abrasive contained in the polishing composition.

In the art disclosed here, an embodiment in which a total proportion of silica abrasive with respect to the total weight of the abrasive contained in the polishing composition is larger than 90% by weight can be preferably performed. The proportion of the silica abrasive is more preferably 95% by weight or more, still more preferably 98% by weight or more, and particularly preferably 99% by weight or more. Among these, a polishing composition in which 100% by weight of abrasive contained in the polishing composition is silica particles is preferable.

In addition, the polishing composition disclosed here may be substantially free of diamond particles as abrasive. Diamond particles can be a factor limiting improvement in smoothness due to their high hardness. In addition, since diamond particles are generally expensive, they are not a beneficial material in terms of cost performance, and the dependence on expensive materials such as diamond particles may be low in consideration of practicality.

(Water-Soluble Polymer)

The polishing composition disclosed here may contain a water-soluble polymer. The weight average molecular weight (Mw) of the water-soluble polymer disclosed here is not particularly limited, and, for example, a compound having a weight average molecular weight (Mw) of 2,000 or more, and typically, larger than 5,000, may be used. Generally, when the Mw of the water-soluble polymer is larger, a surface quality improvement effect tends to be greater. Therefore, for example, a water-soluble polymer having an Mw of larger than 7,000, larger than 9,000, or $1 \times 10^4$ or more can be preferably selected. The upper limit of Mw of the water-soluble polymer is not particularly limited. For example, a water-soluble polymer having an Mw of $200 \times 10^4$ or less can be used. From the standpoint of preventing the occurrence of aggregates, generally, a water-soluble polymer having an Mw of $150 \times 10^4$ or less is preferable, and the Mw is more preferably $100 \times 10^4$ or less, and still more preferably $50 \times 10^4$ or less.

Here, in this specification, a value based on gel permeation chromatography (GPC) (aqueous system, in terms of polyethylene oxide) can be used as the Mw of the water-soluble polymer. "HLC-8320GPC" (model name, commercially available from Tosoh Corporation) may be used as a GPC measuring device. Measurement conditions may be as follows. The same method is used in the following examples.

[GPC Measurement Conditions]
Sample concentration: 0.1% by weight
Column: TSKgel GMPWXL
Detector: differential refractometer
Eluent: 0.1 mol/L $NaNO_3$ aqueous solution
Flow rate: 0.6 mL/min
Measurement temperature: 40° C.
Sample injection amount: 100 μL The water-soluble polymer may have at least one functional group selected from the group consisting of cationic groups, anionic groups, and nonionic groups in a molecule. The water-soluble polymer may have, for example, a hydroxyl group, a carboxy group, a sulfo group, an amide structure, an imide structure, a vinyl structure, a heterocyclic structure, and the like in a molecule. From the standpoint of reducing aggregates, improve cleanability, and the like, a nonionic polymer can be preferably selected.

For example, the water-soluble polymer in the art disclosed here can be selected from among polyvinyl alcohol (PVA), cellulose derivatives, starch derivatives, and polysaccharides.

PVA is generally produced by saponifying polyvinyl esters. Examples of vinyl esters used for synthesis of polyvinyl esters include vinyl acetate, vinyl formate, vinyl propionate, vinyl hexanoate, vinyl caprylate, and vinyl versatate. These vinyl esters can be used alone or two or more thereof can be used in combination. Among these, vinyl acetate is preferable. For example, a PVA which is a saponified product of a polyvinyl ester in which 50 to 100 mol %, 75 to 100 mol % or 90 to 100 mol % of monomers used for synthesis is vinyl acetate is preferable. For example, a PVA which is a saponified product of polyvinyl acetate is preferable.

The degree of saponification of PVA is not particularly limited, but is preferably 80% or more, more preferably 90% or more, still more preferably 95% or more, and particularly preferably 98% or more. For example, a PVA having a degree of saponification of 98% or more (so-called completely saponified PVA) is preferable. In some embodiments of the art disclosed here, a PVA which is a completely saponified product of polyvinyl acetate can be preferably used.

The PVA may be a PVA that is not modified, that is, a non-modified PVA, and may be a modified PVA in which at least a part in the molecule is modified. For example, a modified PVA in which at least some of (for example, 0.1 mol % or more and 10 mol % or less) all monomers constituting a PVA are monomers having a modifying group may be used. Examples of modifying groups include anionic groups such as a carboxy group and a sulfonic acid group.

Examples of cellulose derivatives include hydroxyethyl cellulose, hydroxypropyl cellulose, hydroxyethyl methyl cellulose, hydroxypropyl methyl cellulose, methyl cellulose, ethyl cellulose, ethylhydroxyethyl cellulose, and carboxymethyl cellulose. Examples of starch derivatives include pregelatinized starch, pullulan, carboxymethyl starch, dextrin, and cyclodextrin. Examples of polysaccharides include pectin, gum arabic, lambda carrageenan, kappa carrageenan, iota carrageenan, starch, locust bean gum, xanthan gum, guar gum, trehalose, glycogen, and agarose.

Regarding the water-soluble polymer, an appropriate polymer can be selected from among the above water-soluble polymers. Examples of materials that can be preferably used as the water-soluble polymer include polyvinyl alcohol (PVA) and hydroxyethyl cellulose (HEC).

When a PVA is used as the water-soluble polymer, its Mw may be, for example, 2,000 or more and generally preferably 5,000 or more. In some embodiments, Mw may be $1 \times 10^4$ or more, $3 \times 10^4$ or more, $4 \times 10^4$ or more, $5 \times 10^4$ or more, or $6 \times 10^4$ or more (for example, $6.5 \times 10^4$ or more). The upper limit of Mw is not particularly limited. In consideration of cleanability after polishing, Mw is generally advantageously $100 \times 10^4$ or less, and may be $30 \times 10^4$ or less, $20 \times 10^4$ or less, $15 \times 10^4$ or less or $10 \times 10^4$ or less. In some embodiments, Mw may be $8 \times 10^4$ or less or $7.5 \times 10^4$ or less. In addition, when HEC is used as the water-soluble polymer, its Mw is preferably $1 \times 10^4$ or more, and may be $5 \times 10^4$ or more or $10 \times 10^4$ or more. In some embodiments, Mw may be $20 \times 10^4$ or more or $25 \times 10^4$ or more. In addition, in consideration of reducing aggregation of abrasive and cleanability after polishing, Mw is generally preferably $200 \times 10^4$ or less, more preferably $150 \times 10^4$ or less, still more preferably $100 \times 10^4$ or less, and particularly preferably $70 \times 10^4$ or less. In some embodiments, Mw may be $50 \times 10^4$ or less or $40 \times 10^4$ or less. For example, a water-soluble polymer having an Mw of $20 \times 10^4$ or more and $50 \times 10^4$ or less can be preferably selected.

When a water-soluble polymer is used, the content C4 (a total content when two or more water-soluble polymers are used) of the water-soluble polymer in the polishing composition is not particularly limited. When a PVA is used as the water-soluble polymer, the content C4 can be, for example, 0.001% by weight or more, and is preferably 0.002% by weight or more and more preferably 0.005% by weight or more in consideration of a surface quality improvement effect. In addition, from the standpoint of minimizing a reduction in the polishing removal rate, the content C4 of the water-soluble polymer in the polishing composition is generally preferably 5% by weight or less and more preferably 3% by weight or less, and may be 1.5% by weight or less or 1% by weight or less. In addition, when HEC is used as the water-soluble polymer, the content C4 in the polishing composition can be, for example, 0.001% by weight or more, and is preferably 0.002% by weight or more and more preferably 0.005% by weight or more, in consideration of the surface quality improvement effect. In addition, from the standpoint of minimizing a reduction in the polishing removal rate, the content C4 of the water-soluble polymer in the polishing composition is generally preferably 5% by weight or less and more preferably 3% by weight or less, and may be 1% by weight or less or 0.5% by weight or less.

From the standpoint of exhibiting an effect obtained when sodium metavanadate and a water-soluble polymer are used in combination more favorably and the like, a weight-based content ratio (C4/C1) of the water-soluble polymer to sodium metavanadate is appropriately 10 or less, preferably 5 or less, and more preferably 2.5 or less. In some embodiments, a content ratio (C4/C1) of the water-soluble polymer to sodium metavanadate may be 1.0 or less, 0.75 or less, or 0.5 or less. In addition, the lower limit of the content ratio (C4/C1) of the water-soluble polymer to sodium metavanadate is not limited, but it may be, for example, $1 \times 10^{-4}$ or more, $5 \times 10^{-3}$ or more, or $1 \times 10^{-3}$ or more based on weight. When a combination of sodium metavanadate and a water-soluble polymer in a specific content ratio is used, a balance between a polishing removal rate and surface quality can be achieved at a higher level. In some embodiments, a content ratio (C4/C1) of the water-soluble polymer to sodium metavanadate may be, for example, $1 \times 10^{-4}$ or more and 10 or less, $1 \times 10^{-4}$ or more and 5 or less, or $5 \times 10^{-3}$ or more and 1.0 or less. Within such a range of the content ratio, a polishing removal rate improvement effect can be exhibited more suitably.

(Other Components)

As long as the effects of the present invention are not impaired, the polishing composition disclosed here may further contain, as necessary, known additives that can be used for a polishing composition (typically, a composition for polishing a material with a high hardness, for example, a composition for polishing a silicon carbide substrate) such as a chelating agent, a thickener, a dispersant, a surface protective agent, a wetting agent, a pH adjusting agent, a surfactant, an organic acid, an inorganic acid, a corrosion inhibitor, an antiseptic agent, and an antifungal agent. Since a content of the additive may be appropriately set according to the purpose of addition thereof, and does not characterize the present invention, detailed description thereof will be omitted.

(Solvent)

The solvent used for the polishing composition is not particularly limited as long as the silica abrasive, sodium metavanadate, and hydrogen peroxide can be dispersed or dissolved. Regarding the solvent, ion-exchange water (deionized water), pure water, ultrapure water, distilled water, or the like can be preferably used. The polishing composition disclosed here may further contain, as necessary, an organic solvent that can be uniformly mixed with water (lower alcohol, lower ketone, etc.). Generally, it is preferable that 90 vol % or more of the solvent contained in the polishing composition is water, and it is more preferable that 95 vol % or more (typically, 99 to 100 vol %) thereof is water.

(Oxidant)

The polishing composition disclosed here may contain an oxidant in addition to sodium metavanadate and hydrogen peroxide. Examples of such an oxidant include nitrate compounds such as nitric acid, salts thereof including iron nitrate, silver nitrate, aluminum nitrate, and complexes thereof including cerium ammonium nitrate; persulfate compounds such as persulfuric acids including peroxomonosulfuric acid, peroxodisulfuric acid, and the like, salts thereof including ammonium persulfate, potassium persulfate, and the like; chlorine compounds such as chloric acid and salts thereof, perchloric acid, salts thereof including potassium perchlorate, and the like; bromine compounds such as bromic acid, salts thereof including potassium bromate, and the like; iodine compounds such as iodic acid, salts thereof including ammonium iodate, periodic acid, salts thereof including sodium periodate, potassium periodate, and the like; iron acids such as ferric acid, salts thereof including potassium ferrate, and the like; permanganic acids such as permanganic acid, salts thereof including sodium permanganate, potassium permanganate, and the like; chromic acids such as chromic acid, salts thereof including potassium chromate, potassium dichromate, and the like; ruthenic acids such as perruthenic acid, salts thereof, and the like; molybdic acids such as molybdic acid, salts thereof including ammonium molybdate, disodium molybdate, and the like; rhenic acids such as perrhenic acid, salts thereof, and the like; and tungstic acids such as tungstic acid, salts thereof including disodium tungstate, and the like. These may be used alone or two or more thereof may be used in an appropriate combination.

The content of the oxidant other than sodium metavanadate and hydrogen peroxide in the polishing composition is generally appropriately 3% by weight or less. The content of the oxidant is preferably 1% by weight or less and more preferably 0.5% by weight or less. In some embodiments, the content of the oxidant may be, for example, 0.1% by weight or less, and typically, 0.05% by weight or less. In the art disclosed here, an embodiment in which the polishing composition is substantially free of an oxidant other than sodium metavanadate and hydrogen peroxide can be preferably performed.

The pH of the polishing composition is generally appropriately about 2 to 12. When the pH of the polishing composition is within the above range, a practical polishing removal rate is easily obtained. From the viewpoint of more favorably exhibiting the application effect of the art disclosed here, the pH of the polishing composition is preferably 3 or higher, more preferably 4 or higher, and even more preferably 5.5 or higher. The upper limit of pH is not particularly limited, and is preferably 12 or lower, more preferably 10 or lower, and even more preferably 9.5 or lower. The pH is preferably 3 to 11, more preferably 4 to 10, and further preferably 5.5 to 9.5. The pH of the polishing composition may be, for example, 9 or lower, typically 7.5 or lower.

<Preparation of Polishing Composition>

A method for preparing the polishing composition disclosed here is not particularly limited. For example, the respective components contained in the polishing composition may be mixed using a well-known mixing device such as a blade type stirrer, an ultrasonic disperser, a homomixer or the like. A mode in which these components are mixed is not particularly limited, and, for example, all components may be mixed at once or may be mixed according to an appropriately set order.

The polishing composition disclosed here may be of one-agent type or a multi-agent type including a two-agent type. For example, the polishing composition may be configured to be prepared by mixing Part A containing some of components (typically, components other than the solvent) constituting the polishing composition and Part B containing the remaining components and to be used to polish an object to be polished.

<Concentrate>

The polishing composition disclosed here may be in a concentrated form (that is, a form of a concentrate of the polishing slurry) before it is supplied to an object to be polished. The polishing composition in such a concentrated form is advantageous from the viewpoints of convenience, cost reduction and the like during production, distribution, storage, and the like. The concentration factor can be, for example, about 2 times to 5 times in terms of volume.

The polishing composition in such a concentrated form can be used in a mode in which a polishing slurry is prepared by dilution at a desired timing and the polishing slurry is supplied to an object to be polished. The dilution can be typically performed by adding the above-described solvent to the concentrate and performing mixing. In addition, when the solvent is a mixed solvent, only some of components constituting the solvent may be added and diluted or a mixed solvent containing such constituent components in an amount ratio different from that of the solvent may be added and diluted. In addition, in a multi-agent type polishing composition as will be described below, some agents among these may be diluted and other agents may be then mixed to prepare a polishing slurry or a plurality of agents may be mixed and the resulting mixture may be then diluted to prepare a polishing slurry.

<Polishing Method>

The polishing composition disclosed here can be used for polishing an object to be polished, for example, in an embodiment including the following operations.

That is, a polishing slurry containing any of the polishing compositions disclosed here is prepared. Preparation of the polishing slurry may include preparation of a polishing slurry by performing operations such as concentration adjustment (for example, dilution) and pH adjustment on the polishing composition. Alternatively, the polishing composition may be directly used as a polishing slurry. In addition, in the case of a multi-agent type polishing composition, preparation of the polishing slurry may include mixing such agents, diluting one or a plurality of agents before the mixing, diluting the resulting mixture after the mixing and the like.

Next, the polishing slurry is supplied to the surface of the object and polished by a general method. For example, an object to be polished is set in a general polishing machine, the polishing slurry is supplied to the surface (polishing target surface) of the object through a polishing pad of the polishing machine. Typically, while the polishing slurry is continuously supplied, the polishing pad is pressed against the surface of the object, and they are moved relative to each other (for example, rotated and moved). Polishing of the object is completed through such a polishing step.

According to the description herein, a polishing method of polishing a material to be polished and a method of producing a polished object by using the polishing method are provided. The polishing method includes a step of polishing an object to be polished using the polishing composition disclosed here. A polishing method according to a preferred embodiment includes a step of performing preliminary polishing (stock polishing step) and a step of performing final polishing (final polishing step). The stock polishing step herein refers to a step of performing preliminary polishing on an object to be polished. In a typical embodiment, the stock polishing step is a polishing step set immediately before the final polishing step. The stock polishing step may be a single-step of polishing or a polishing step in two or more sub-steps. The final polishing step herein refers to a step of performing final polishing on an object to be polished on which stock polishing is performed and is a polishing step provided at the end (that is, on the most downstream side) among polishing steps performed using a polishing composition. In such a polishing method including a stock polishing step and a final polishing step, the polishing composition disclosed here may be used in the stock polishing step or may be in the final polishing step, or in both the stock polishing step and the final polishing step.

In a preferred embodiment, a polishing step using the polishing composition is a final polishing step. The polishing composition disclosed here can effectively reduce scratches and the like on a surface after polishing, and thus can be particularly preferably used as a polishing composition (composition for final polishing) used in a final polishing step performed on a surface of a material to be polished.

In another preferred embodiment, a polishing step using the polishing composition may be a stock polishing step. The polishing composition disclosed here is suitable as a polishing composition (composition for stock polishing) used for a stock polishing step performed on a surface of a material to be polished since a high polishing removal rate can be achieved. When the stock polishing step includes a polishing step of a plurality sub-steps of two or more, any of the polishing compositions disclosed here can be used in the polishing step including the sub-steps. The polishing composition disclosed here can be preferably applied for the former sub-step (upstream) in stock polishing. For example, it can also be preferably used in an initial stock polishing step (typically, the first polishing step) after a lapping step to be described below.

The stock polishing and the final polishing can be applied to both polishing using a single-side polishing machine and polishing using a double-side polishing machine. In the single-side polishing machine, an object to be polished is adhered to a ceramic plate with wax or the object is held using a holder called a carrier, and while a polishing composition is supplied, a polishing pad is pressed against one side of the object, they are moved relative to each other (for example, rotated and moved), and thus one side of the object is polished. In the double-side polishing machine, an object to be polished is held using a holder called a carrier, and while a polishing composition is supplied from above, a polishing pad is pressed against a side opposite to the object, these are rotated in a relative direction, and thus both sides of the object are polished at the same time.

The polishing pad used in each polishing step disclosed here is not particularly limited. For example, any polishing pad of a non-woven fabric type, a suede type, a hard foamed polyurethane type, a type containing abrasive, and a type containing no abrasive may be used.

A polished object that is polished by the method disclosed here is typically cleaned after polishing. This cleaning can be performed using an appropriate cleaning solution. A cleaning solution to be used is not particularly limited, and known or conventional ones can be appropriately selected and used.

The polishing method disclosed here may include any other step in addition to the stock polishing step and the final polishing step. Examples of such a step include a lapping step performed before the stock polishing step. The lapping step is a step of polishing an object to be polished by pressing the surface of a polishing platen (for example, a cast iron platen) against the object. Therefore, in the lapping step, no polishing pad is used. The lapping step is typically performed by supplying abrasive (typically, diamond abrasive) between the polishing platen and the object. In addition, the polishing method disclosed here may include additional steps (a cleaning step or a polishing step) before the stock polishing step or between the stock polishing step and the final polishing step.

<Method for Producing Polished Object>

The art disclosed here may include a method for producing a polished object (for example, a method for producing a silicon carbide substrate) including a polishing step using the polishing composition and a polished object produced by the method. That is, according to the art disclosed here, provided is a method for producing a polished object including supplying any of the polishing compositions disclosed here to an object made of a material to be polished and polishing the object, and a polished object produced by the method. The production method can be performed by preferably applying details of any of the polishing methods disclosed here. According to the production method, a polished object (for example, a silicon carbide substrate) can be efficiently provided.

EXAMPLES

Several examples relating to the present invention will be described below, but the present invention is not intended to be limited to those indicated in the examples. Here, in the following description, "%" is on a weight basis unless otherwise specified.

Water-soluble polymers used in the following examples are as follows.

PVA: polyvinyl alcohol having an Mw of $7\times10^4$ and a degree of saponification of 98% or more HEC: hydroxyethyl cellulose having an Mw of $28\times10^4$

[Experiment 1]
<Preparation of Polishing Composition>

Examples 1 to 10

Polishing compositions of Examples 1 to 10 were prepared by mixing a metavanadate, hydrogen peroxide, colloidal silica, and deionized water. The pH of the polishing compositions were adjusted to 6.5 using potassium hydroxide (KOH). For the polishing compositions of the respective examples, the cation and content C1 of metavanadate used, the content C2 of hydrogen peroxide, a ratio of the content C2 of hydrogen peroxide to the content C1 of metavanadate (C2/C1), the content C3 of colloidal silica, and a ratio of the content C3 of colloidal silica to the content C1 of metavanadate (C3/C1) are summarized in Table 1. Here, a globular colloidal silica having a D1 of 34 nm and a D2 of 76 nm was used.

<Evaluation of Polishing Removal Rate>

The prepared polishing compositions of the examples were directly used as polishing slurry, and polishing was performed on the surface of SiC wafers on which polishing had been performed in advance using a polishing slurry containing permanganic acid as an oxidant under the following conditions. Then, a polishing removal rate was calculated according to the following calculation formulae (1) and (2). The results are shown in the appropriate column of Table 1.

(1) Polishing removal [cm]=a difference in weight of SiC wafer before and after polishing [g]/density of SiC [g/cm$^3$](=3.21 g/cm$^3$)/polishing target area [cm$^2$](=19.62 cm$^2$)

(2) Polishing removal rate [nm/h]=polishing removal [cm]×10$^7$/polishing time(=0.5 hours)

[Polishing Conditions]
Polishing machine: Single-side polishing machine, model "EJ-3801N" manufactured by Engis Japan Corporation
Polishing pad: "SUBA800" manufactured by Nitta Haas Incorporated
Polishing pressure: 300 g/cm$^2$
Platen rotational speed: 80 rpm
Polishing time: 1 hour
Head rotational speed: 40 rpm
Flow rate of polishing slurry: 20 mL/minutes (used in one-way)
Temperature of polishing slurry: 25° C.
Object to be polished: SiC wafer (conductivity type: n-type, crystalline type 4H 4° off) 2 inches×3 sheets <Surface Quality>

For the surfaces of the polished objects after being polished by the respective examples, the surface roughness Ra (nm) was measured at 22 points on the wafer surface by using an atomic force microscope (AFM) (model XE-HDM, commercially available from Park Systems) under conditions of a measurement area of 10 μm×10 μm, and the average value thereof was obtained. In addition, the number of scratches with a length of 1 μm or more was calculated within the measurement field of view for the 22 points. The results are shown in the column "surface quality" in Table 1. Here, when the surface roughness Ra was less than 0.04 nm and the number of scratches was 1 or less, the surface quality was evaluated as "AA", when the surface roughness Ra was 0.04 nm or more and less than 0.05 nm and the number of scratches was 1 or less, the surface quality was evaluated as "A", when the surface roughness Ra was 0.05 nm or more and less than 0.06 nm and the number of scratches was 1 or less or when the surface roughness Ra was less than 0.05 nm and the number of scratches was 2 or more, the surface quality was evaluated as "B", and when the surface roughness Ra was 0.05 nm or more and less than 0.06 nm and the number of scratches was 2 or more or the surface roughness Ra was 0.06 nm or more, the surface quality was evaluated as "C".

TABLE 1

| | Vanadate | | Hydrogen peroxide | | Colloidal silica | | Polishing removal | |
|---|---|---|---|---|---|---|---|---|
| | Cation | Content C1 (%) | Content C2 (%) | Ratio (C2/C1) | Content C3 (%) | Ratio (C3/C1) | rate (nm/hr) | Surface quality |
| Ex. 1 | Na | 0.9 | 1.6 | 1.8 | 30 | 33.3 | 139 | A |
| Ex. 2 | Na | 1.2 | 1.8 | 1.5 | 36 | 30 | 168 | A |
| Ex. 3 | Na | 1.8 | 1.2 | 0.7 | 30 | 16.7 | 177 | A |
| Ex. 4 | Na | 1.8 | 2.7 | 1.5 | 30 | 16.7 | 152 | A |
| Ex. 5 | Na | 0.9 | 1.6 | 1.8 | 45 | 50 | 164 | B |
| Ex. 6 | Na | 0.45 | 0.9 | 2 | 20 | 44.4 | 99 | B |
| Ex. 7 | Na | 1.35 | 0.9 | 0.7 | 10 | 7.4 | 95 | B |
| Ex. 8 | NH4 | 0.45 | 3 | 6.7 | 10 | 22.2 | 61 | C |
| Ex. 9 | NH4 | 0.45 | 0.3 | 0.7 | 10 | 22.2 | 82 | B |
| Ex. 10 | Na | 4.5 | 1.2 | 0.3 | 30 | 6.7 | 85 | C |

As shown in Table 1, when the polishing compositions of Examples 1 to 5 containing 0.7% to 3.5% by weight of sodium metavanadate, 0.3% to 3% by weight of hydrogen peroxide, and 12% to 50% by weight of silica abrasive in combination were used, a more favorable result of the polishing removal rate than in Examples 6 to 10 was obtained. In addition, when the polishing compositions of Examples 1 to 4 were used, the surface quality was improved compared with in Examples 6 to 10. Based on such results, it was found that the polishing removal rate could be improved while improving surface quality using a combination of specific contents of sodium metavanadate, hydrogen peroxide, and silica abrasive.

[Experiment 2]
<Preparation of Polishing Composition>

Examples 11 to 16

Polishing compositions of Examples 11 to 16 were prepared by mixing the polishing composition of Example 3 with water-soluble polymers of different types and amounts. The pH of the polishing compositions were adjusted to 6.5 using potassium hydroxide (KOH). For the polishing compositions of the respective examples, the cation and content C1 of metavanadate used, the content C2 of hydrogen peroxide, a ratio of the content C2 of hydrogen peroxide to the content C1 of metavanadate (C2/C1), the content C3 of colloidal silica, a ratio of the content C3 of colloidal silica to the content C1 of metavanadate (C3/C1), and the type and content C4 of the water-soluble polymer are summarized in Table 2.

<Evaluation of Polishing Removal Rate>
The prepared polishing compositions of the examples were directly used as polishing slurry, and polishing was performed on the surface of SiC wafers on which polishing had been performed in advance using a polishing slurry containing permanganic acid as an oxidant under the same conditions as in Experiment 1. Then, the polishing removal rate was calculated according to the same calculation formulae as in Experiment 1. The results are shown in the corresponding column in Table 2.

<Surface Quality>
The surfaces of the polished objects after being polished by the respective examples were evaluated in the same manner as in Experiment 1. The results are shown in the column "surface quality" in Table 2. Here, when the surface roughness Ra was less than 0.04 nm and the number of scratches was 1 or less, the surface quality was evaluated as "AA", when the surface roughness Ra was 0.04 nm or more and less than 0.05 nm and the number of scratches was 1 or less, the surface quality was evaluated as "A", when the surface roughness Ra was 0.05 nm or more and less than 0.06 nm and the number of scratches was 1 or less or the surface roughness Ra was less than 0.05 nm and the number of scratches was 2 or more, the surface quality was evaluated as "B", and when the surface roughness Ra was 0.05 nm or more and less than 0.06 nm and the number of scratches was 2 or more or the surface roughness Ra was 0.06 nm or more, the surface quality was evaluated as "C".

TABLE 2

| | Vanadate | | Hydrogen peroxide | | Colloidal silica | | Water-soluble polymer | | Polishing removal | |
|---|---|---|---|---|---|---|---|---|---|---|
| | Cation | Content C1 (%) | Content C2 (%) | Ratio (C2/C1) | Content C3 (%) | Ratio (C3/C1) | Type | Content C4 (%) | rate (nm/hr) | Surface quality |
| Ex. 11 | Na | 1.8 | 1.2 | 0.7 | 30 | 16.7 | PVA | 0.01 | 175 | AA |
| Ex. 12 | Na | 1.8 | 1.2 | 0.7 | 30 | 16.7 | PVA | 1.0 | 160 | AA |
| Ex. 13 | Na | 1.8 | 1.2 | 0.7 | 30 | 16.7 | PVA | 2.0 | 80 | A |
| Ex. 14 | Na | 1.8 | 1.2 | 0.7 | 30 | 16.7 | HEC | 0.1 | 165 | AA |
| Ex. 15 | Na | 1.8 | 1.2 | 0.7 | 30 | 16.7 | HEC | 0.5 | 140 | AA |
| Ex. 16 | Na | 1.8 | 1.2 | 0.7 | 30 | 16.7 | HEC | 1.0 | 50 | A |

As shown in Table 2, it was found that, when the polishing compositions of Examples 11 to 16 containing a water-soluble polymer or a surfactant were used, the surface quality was improved compared with in Examples 1 to 4. Based on such results, it was found that the surface quality could be further improved using a water-soluble polymer or a surfactant.

While specific examples of the present invention have been described above in detail, these are only examples, and do not limit the scope of the claims. The techniques recited in the claims include various modifications and alternations of the specific examples exemplified above.

The invention claimed is:

1. A polishing composition used for polishing an object to be polished, the polishing composition comprising:
sodium metavanadate, hydrogen peroxide, and silica abrasive, wherein
the content C1 of sodium metavanadate is 0.7% to 3.5% by weight,
the content C2 of hydrogen peroxide is 0.3% to 3% by weight,
the content C3 of the silica abrasive is 12% to 50% by weight, and
a weight-based ratio of the content C3 of the silica abrasive to the content C1 of sodium metavanadate (C3/C1) is 12.5 or more and 20 or less.

2. The polishing composition according to claim 1, wherein
a weight-based ratio of the content C2 of hydrogen peroxide to the content C1 of sodium metavanadate (C2/C1) is 0.5 or more and 2 or less.

3. The polishing composition according to claim 1, further comprising:
a water-soluble polymer.

4. The polishing composition according to claim 1, wherein
a material constituting the object has a Vickers hardness of 1,500 Hv or higher.

5. The polishing composition according to claim 1, wherein
a material constituting the object is silicon carbide.

6. A polishing method comprising:
supplying the polishing composition according to claim 1 to an object to be polished and polishing the object.

7. A polishing composition used for polishing an object to be polished, the polishing composition consisting of:
sodium metavanadate, hydrogen peroxide, silica abrasive, a water-soluble polymer, a pH-adjusting agent and water, wherein
the content C1 of sodium metavanadate is 0.7% to 3.5% by weight,
the content C2 of hydrogen peroxide is 0.3% to 3% by weight,
the content C3 of the silica abrasive is 12% to 50% by weight,
the content of the water-soluble polymer is 0.5% by weight or less, and
a weight-based ratio of the content C3 of the silica abrasive to the content C1 of sodium metavanadate (C3/C1) is 12.5 or more and 20 or less.

8. The polishing composition according to claim 7, wherein
a weight-based ratio of the content C2 of hydrogen peroxide to the content C1 of sodium metavanadate (C2/C1) is 0.5 or more and 2 or less.

9. The polishing composition according to claim 7, wherein a material constituting the object to be polished has a Vickers hardness of 1,500 Hv or higher.

10. The polishing composition according to claim 7, wherein a material constituting the object to be polished is silicon carbide.

11. A polishing method comprising:
supplying the polishing composition according to claim 7 to an object to be polished and polishing the object.

* * * * *